United States Patent
Munzer et al.

(10) Patent No.: US 11,576,274 B2
(45) Date of Patent: Feb. 7, 2023

(54) DEVICE FOR DETECTING AND REGISTERING OF MEASUREMENT DATA

(71) Applicant: Testo SE & Co. KGaA, Lenzkirch (DE)

(72) Inventors: Markus Munzer, Hufingen (DE); Siegfried Stallmann, Bonndorf (DE); Meinrad Gotz, Bonndorf (DE); Svenja Storz, Furtwangen (DE)

(73) Assignee: Testo SE & Co. KGaA, Lenzkirch (DE)

( * ) Notice: Subject to any disclaimer, the term of this patent is extended or adjusted under 35 U.S.C. 154(b) by 539 days.

(21) Appl. No.: 16/704,318

(22) Filed: Dec. 5, 2019

(65) Prior Publication Data

US 2020/0187373 A1  Jun. 11, 2020

(30) Foreign Application Priority Data

Dec. 11, 2018 (DE) .................... 102018131719.0

(51) Int. Cl.
| | |
|---|---|
| *H05K 5/06* | (2006.01) |
| *H05K 5/00* | (2006.01) |
| *G01K 1/08* | (2021.01) |
| *H05K 5/03* | (2006.01) |

(52) U.S. Cl.
CPC ............ *H05K 5/066* (2013.01); *G01K 1/08* (2013.01); *H05K 5/0004* (2013.01); *H05K 5/03* (2013.01); *G01K 2215/00* (2013.01)

(58) Field of Classification Search
CPC .... G01K 1/08; G01K 2215/00; H05K 5/0004; H05K 5/03; H05K 5/066
See application file for complete search history.

(56) References Cited

U.S. PATENT DOCUMENTS

| | | | | |
|---|---|---|---|---|
| 4,574,328 A | * | 3/1986 | Maier | .................. G01F 23/268 |
| | | | | 73/304 C |
| 5,796,011 A | * | 8/1998 | Keita | .................... G01F 15/024 |
| | | | | 73/861.357 |
| 6,662,120 B2 | * | 12/2003 | Drahm | .................. G01F 1/8477 |
| | | | | 702/45 |
| 9,572,273 B2 | * | 2/2017 | Blunier | ............. A61B 5/14503 |

FOREIGN PATENT DOCUMENTS

WO  2017/097526  *  6/2017

* cited by examiner

*Primary Examiner* — Carl J Arbes
(74) *Attorney, Agent, or Firm* — Volpe Koenig

(57) ABSTRACT

A device (1) for the detecting and registering of measurement data, having a first housing (2) in which electronics (7) are arranged, and having at least one sensor (14), which is electrically connected to the electronics (7). The first housing (2) includes at least two housing parts (3, 4), having at least one metallic connection site and being joined together at the connection site by a gas-tight metal/metal connection. The at least one sensor (13) is arranged in a second housing (11), which encloses the first housing (2) substantially entirely, and which includes at least two housing parts (12, 15), which are detachably joined together or can be so joined.

13 Claims, 3 Drawing Sheets

DEVICE FOR DETECTING AND REGISTERING OF MEASUREMENT DATA

INCORPORATION BY REFERENCE

The following documents are incorporated herein by reference as if fully set forth: German Patent Application No. DE 10 2018 131 719.0, filed Dec. 11, 2018.

BACKGROUND

The invention describes a device for the detecting and registering of measurement data, having a first housing in which electronics are arranged, and having at least one sensor, which is electrically connected to the electronics. Such a device is also called a data logger. Such data loggers are used where metered values need to be detected over a lengthy period of time, yet no stationary measurement equipment can be attached there.

Data loggers usually have at least one sensor or measuring probe for converting a metered quantity into a measurement value and electronics for the detection and chronological registration of the measurement values. The data logger furthermore has an interface for the reading out of the measurement values or a removable storage medium on which the measurement values can be stored.

The invention concerns a data logger which is to be used in sterile environments. In this application of the data logger, the demand exists of the device needing to be autoclavable in order to be sterilized for a further use.

During autoclaving, the device is heated from −50 to 140 degrees Celsius and subjected to a pressure of around 3.5 bar. Under these conditions, and with appropriate humidity, so-called saturated steam is formed, i.e., a saturation which, under normal pressure conditions, would have long since condensed out.

This saturated steam is able to penetrate into the tiniest gaps also due to the large excess pressure. This is especially harmful to the electronics, which may as a result become corroded in very short time and thus cannot withstand the autoclaving.

In the prior art, it is known how to protect electronic circuits and components against harmful environmental factors by covering the electronics entirely with a casting compound.

Yet here the problem exists that, at the large temperature differences during autoclaving, the casting compound and the electronics expand to different extents and therefore stress cracks or other damage to the electronics may occur.

SUMMARY

Therefore, the object is to create a protection for the electronics of a data logger that withstands the required autoclaving conditions.

This objective is achieved according to the invention by a device with one or more features of the invention.

The device according to the invention is characterized in that the housing comprises at least two housing parts, wherein the two housing parts have at least one metallic connection site and are joined together at the connection site by a gas-tight metal/metal connection.

The advantage is that the electronics are hermetically sealed inside the housing, and this sealing is absolutely secure and reliable due to the metal/metal connection.

A further advantage is that the electronics do not need to be encased, so that no cracks or stresses can form due to thermal expansion.

On the whole, the electronics are protected by the metal/metal connection completely against the autoclaving, so that even a very large number of autoclaving cycles can be survived, especially over 800. In this way, the device according to the invention can be used for very long and it is accordingly cost-effective.

It is especially advantageous when the gas-tight metal/metal connection is produced by welding or brazing. A very good sealing can be achieved in particular by welding.

In one advantageous embodiment of the invention, the electronics are arranged in a first housing, comprising at least two housing parts, which are joined together by the gas-tight metal/metal connection, and the at least one sensor is arranged in a second housing, which encloses the first housing substantially entirely, and which comprises at least two housing parts, which are detachably joined together or can be so joined.

The sensor is generally less vulnerable, so that it is arranged in the second encircling housing. It is advantageous for the second housing to be formed of at least two parts and for the first housing to be insertable or installable in the second housing. In this way, for example, an electronics can be combined with different sensors in different second housings.

In one advantageous embodiment, the first housing comprises a tube, and the end face openings of the tube are closed by covers, wherein at least one cover comprises a gas-tight metal/metal connection to the tube. In particular, the tube is seamless; for example, it is made by deep drawing or another production process. A seamless tube is much more stable, since no axial weld seam runs along the tube, being subjected to thermal stresses.

In one variant, one of the covers is joined as a single piece to the tube, so that the first housing is formed of two parts. The cover is placed axially onto the tube and joined to the tube by welding, for example.

In an alternative embodiment, both covers are each placed axially onto the tube at the end faces and welded to it.

The first housing and the second housing may be electrically interconnected in various ways. For example, a plug connection may be formed or a noncontact connection can be formed. Energy for the operation of the electronics could be transmitted inductively, for example, and the measurement data of the sensor could be transmitted optically.

One preferred embodiment, however, comprises at least one feedthrough in at least one of the covers, with which an electrical connection is produced between the first housing and the second housing. Such a feedthrough may be sealed significantly more tightly than a plug connection.

In particular, the feedthrough can be designed as a glass/metal bushing. Such glass/metal bushings are known in principle and form a tight connection similar to welding between the housing parts. On the whole, a hermetically tight encapsulation of the electronics is produced in this way.

The tube and/or the first housing may have any given cross section or any given shape. However, it is especially advantageous for the first housing and/or the second housing to have a circular cross section. In this way, in particular, the welded seam with the cover can be formed with no corners where stress peaks may occur.

One embodiment of the invention calls for the electronics to be arranged on a circuit board, and for the circuit board to be mounted floating inside the first housing or to be secured on one side. In this way, mechanical stresses, for example caused by thermal expansion of the housing, are prevented from being transmitted to the circuit board, where they might damage the electronics.

In one advantageous embodiment, the circuit board is connected to at least one feedthrough by a flexible conductor. Such a flexible conductor may be a cable or a flexible circuit board. In this way, mechanical stresses are decoupled by the housing from the circuit board.

In one preferred embodiment, the circuit board is electrically and/or mechanically connected on one side to the feedthrough by a c-board. In this way, the circuit board is held inside the interior space of the first housing. On the other hand, an adequate mechanical decoupling from the housing exists on account of the only one-sided fastening, so that no mechanical stresses are transmitted from the housing to the circuit board. The c-board furthermore produces the electrical connection between feedthrough and circuit board.

It may be especially advantageous when the c-board has a mechanical encoding, so that the circuit board can only be installed in a correct orientation. This ensures a correct electrical contacting and function.

In one preferred embodiment of the invention, the at least one sensor is arranged in a first housing part of the second housing and a power supply, especially a battery or an accumulator, is arranged in a second housing part of the second housing. The first housing is arranged axially between the two housing parts of the second housing. The two housing parts of the second housing may be designed so that the first housing is entirely enclosed by these.

However, the second housing may also comprise further housing parts serving to receive the first housing and/or to connect the individual housing parts of the second housing.

It is especially expedient for the second housing to comprise a sleeve part, in which the first housing is axially installed or can be so installed. In this way, the first housing is held securely inside the second housing.

In one embodiment of the invention, the housing parts of the second housing can be joined together by threads. For this, the individual housing parts each have at least cylindrical segments which optionally possess an internal thread or an external thread. In this way, the devices according to the invention can be easily screwed together from the individual parts. Alternatively, bayonet connections or other fastening elements can also be used.

This is advantageous for adapting different sensors to the basic module. Likewise, the battery is adapted to the device interchangeably by a screw connection.

In one embodiment of the invention, it is provided that all threads, except for the thread for removing of the battery, have a thread locking, which prevents an unintentional and/or unauthorized opening.

This thread locking ensures that the user when changing the battery only loosens the battery screw connection, and not the screw connection of the other housing parts. If the user opens the housing, it will lose its tightness and can no longer be used. The device should only be able to be opened by service personnel at the manufacturer's location.

Due to the fact that plastic relaxes under mechanical stress, it cannot be guaranteed which screw connection (housing or battery) will be the first to loosen. Neither does a large tightening torque on the logger act as a security, since in the application the plastic will relax in accelerated manner under temperature influence. It has been demonstrated during experiment series that tightening torques of 2.5 Nm will break down to 0 Nm.

It is especially advantageous for the thread locking to be worked into the steel thread by a shape deviation. It is assumed in this case that individual housing parts are made of steel or have a steel thread. When a plastic thread is screwed into the shape deviation of a steel thread, a plastic and elastic deformation of the plastic results in this area. A form fit is now produced, which is temperature independent. The thread of the battery fastening does not undergo any shape deviation, and therefore it cannot generate a break-away torque which is greater than the other housing screw fastenings.

It may be expedient to work a shape deviation into the steel threads by a laser or inner knurling tool.

An alternative embodiment of the invention is characterized in that the electronics are arranged in a first housing, and the at least one sensor is arranged in a second housing, which substantially entirely encloses the first housing and which comprises at least two housing parts that are joined together by the gas-tight metal/metal connection. In this way, the electronics can be arranged in a cost-effective housing, since the hermetic seal is provided by the enclosing second housing.

It is especially advantageous when the housing parts or some of the housing parts of the first housing and/or of the second housing are made of a stainless steel. Stainless steel is especially rust-free and thus withstands the autoclaving conditions.

Preferably, the first housing is formed of a low-sulphur stainless steel. The advantage is that welded connections can be formed to be especially tight and in particular free of hairline cracks. The sulphur content is preferably between 0.015 and 0.025 wt. percent. Such a steel is known for example under the German steel code TK 1.4404.

The second housing may be formed of metal, plastic and/or ceramic. It is also possible for individual housing parts of the second housing to be formed of different materials.

BRIEF DESCRIPTION OF THE DRAWINGS

The invention is described in more detail in the following with the aid of a preferred exemplary embodiment, making reference to the enclosed drawings.

Shown are.

DETAILED DESCRIPTION

Figure 1:
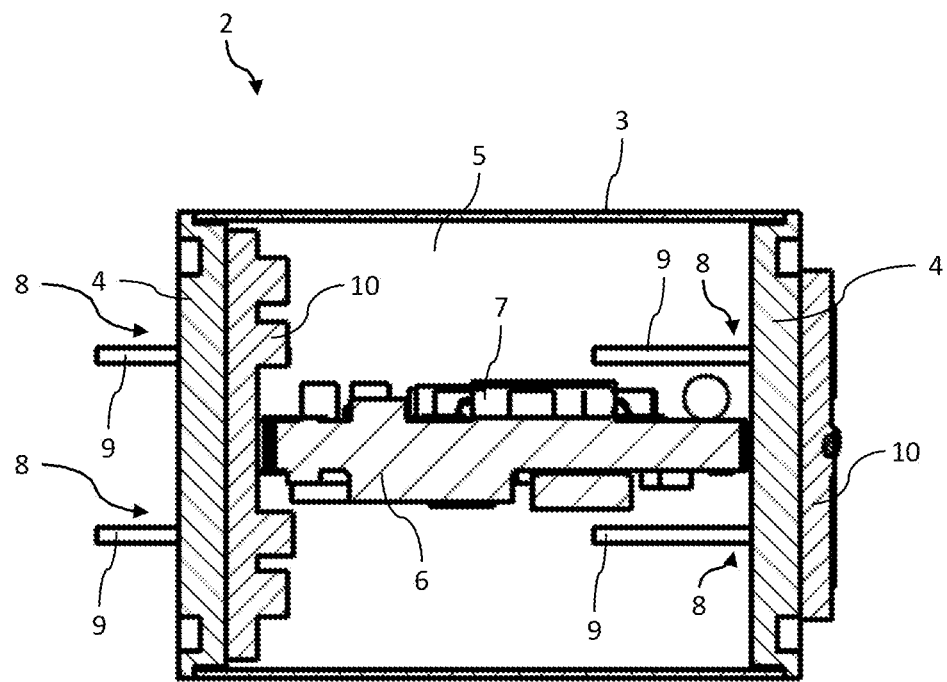
FIG. 1 a longitudinal section through the first housing of a device according to the invention, FIG. 2 a perspective view of a device according to the invention, FIG. 3 a longitudinal section through the device of FIG. 2, FIG. 4 a perspective view of a second device according to the invention, and FIG. 5 a longitudinal section through the device of FIG. 4.

FIG. 1 shows a preferred embodiment of a first housing 2 of a device 1 according to the invention. The first housing 2 comprises a hollow cylinder 3, which is produced seamlessly from a stainless steel. At the two end faces there are arranged covers 4, which likewise is formed of the same stainless steel. The two covers 4 are each welded gas-tight to the hollow cylinder 3. In order to obtain a gas-tight welded seam which is in particular free of hairline cracks, the stainless steel is a low-sulphur stainless steel.

In this way, the interior space 5 of the first housing 2 is protected against external influences. In the interior space 5 there is located a circuit board 6, on which the electronics 7 for the detecting, evaluating and registering of measurement data is situated.

Glass/metal feedthroughs 8 are arranged respectively in the two covers 4, whereby a contact pin 9 is led through an opening in the cover 4, being sealed off by glass.

In the example shown, a c-board 10 is arranged on the left cover 4 in the interior space 5, being electrically connected to the contact pins 9. The circuit board 6 is secured and electrically contacted on the c-board 10, so that the contact pins 9 are electrically connected to the circuit board 6 and thus the electronics 7.

The contact pins 9 of the opposite cover 4 are also connected for manufacturing reasons by flexible conductors, such as cables, to the circuit board 6. On this side, the contact pins 9 are connected on the outside of the cover 4 to a c-board 10.

This one-sided fastening of the circuit board 6 in the interior space 5 prevents the transmittal of expansion stresses from the first housing 2 to the circuit board 6 and vice versa.

Figure 3:
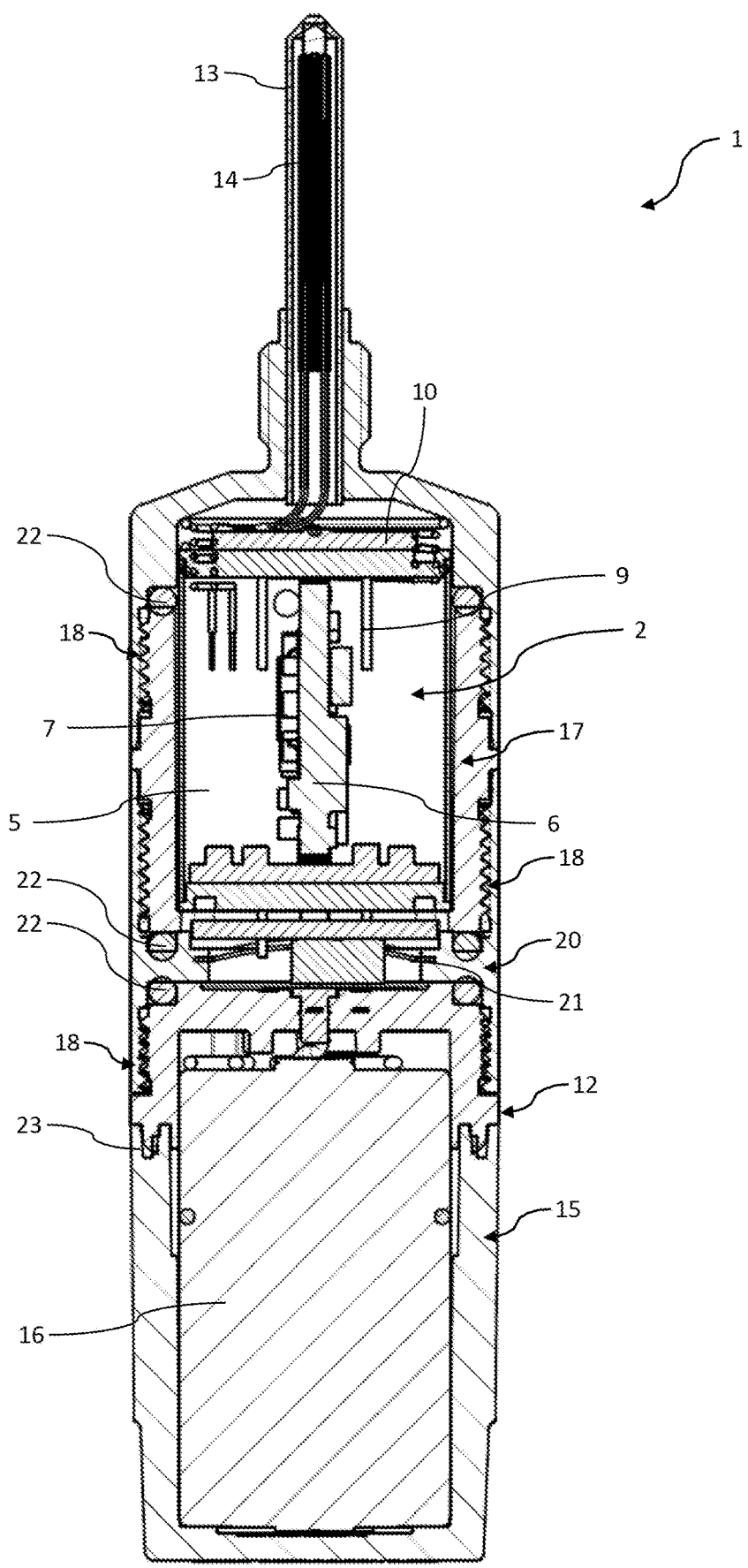

FIG. 3 shows a preferred embodiment of a device according to the invention 1. The device comprises a second housing 11, which is formed in the example of four housing parts. A first housing part 12 comprises a measuring tip 13, in which a sensor 14 is arranged, such as a temperature sensor. In a cylindrical segment, the first housing part 12 comprises an internal thread 18.

A second housing part 15 comprises a battery 16 or an accumulator. The battery 16 may be replaceable. For this, the second housing part 15 in the example can be opened axially at a closure 23. This may likewise be done via a thread or a bayonet. However, an accumulator may also be provided, which can be inductively charged, for example. The second housing part 15 has an external thread 19 in a cylindrical segment.

A third housing part 17 is configured as a sleeve, in which the first housing 2 can be installed axially. The sleeve 17 for this purpose is configured as a hollow cylinder, whose inner diameter is adapted to the outer diameter of the hollow cylinder 3 of the first housing 2. External threads 19 are arranged on the outer circumference of the sleeve 17.

A fourth housing part 20 is designed as a sleeve with internal threads 18.

Figure 2:
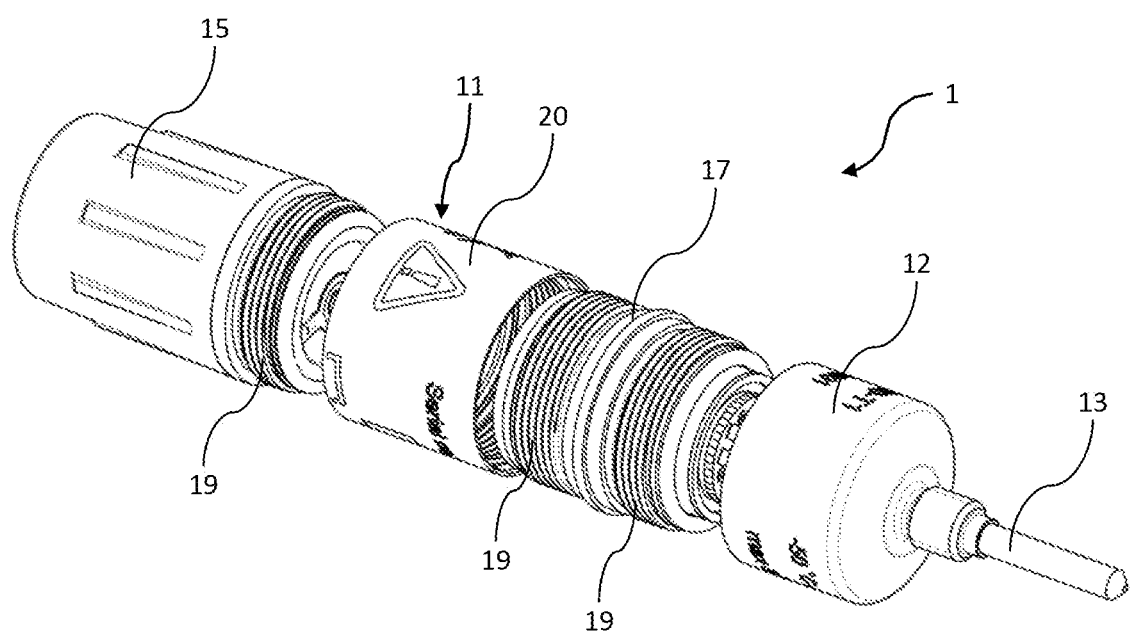

FIG. 2 shows how the individual housing parts of the second housing 11 are joined together. The second housing part 15 can be joined by means of the fourth housing part 20 to the third housing part 17 via the respective threads. The first housing part 12 can be screwed onto the third housing part 17. Preferably, the threads in particular between the first, third and fourth housing parts have a thread locking, which prevents an unintentional or unauthorized loosening of the screw connection. This thread locking may be produced for example by a shape deviation in the thread, bringing about a plastic deformation for a form-fitting connection. However, only the closure 23 can also be designed without such a thread locking. This ensures that the battery 16 can be removed without risk of inadvertently opening the housing.

The fourth housing part 20 furthermore comprises a contact 21, which on the one hand produces an electrical connection with the contact pins 9 of the first housing 2 and on the other hand with the second housing part. In this way, an electrical contacting of the battery 16 with the electronics 6 is assured.

Likewise, the first housing part 12 has a contact 21, which makes contact with the c-board 10 and by which the sensor 14 is electrically connected to the electronics 7 in the first housing 2.

Between the individual housing parts of the second housing 11 are arranged seals 22, which protect the second housing 11 against the penetration of moisture. In the example, the seals 22 are formed as O-rings, which are axially press fitted between the individual housing parts.

The second housing 11 may be formed of plastic, ceramic, or another material. It is also possible for individual housing parts to be made of different materials.

Figure 4:
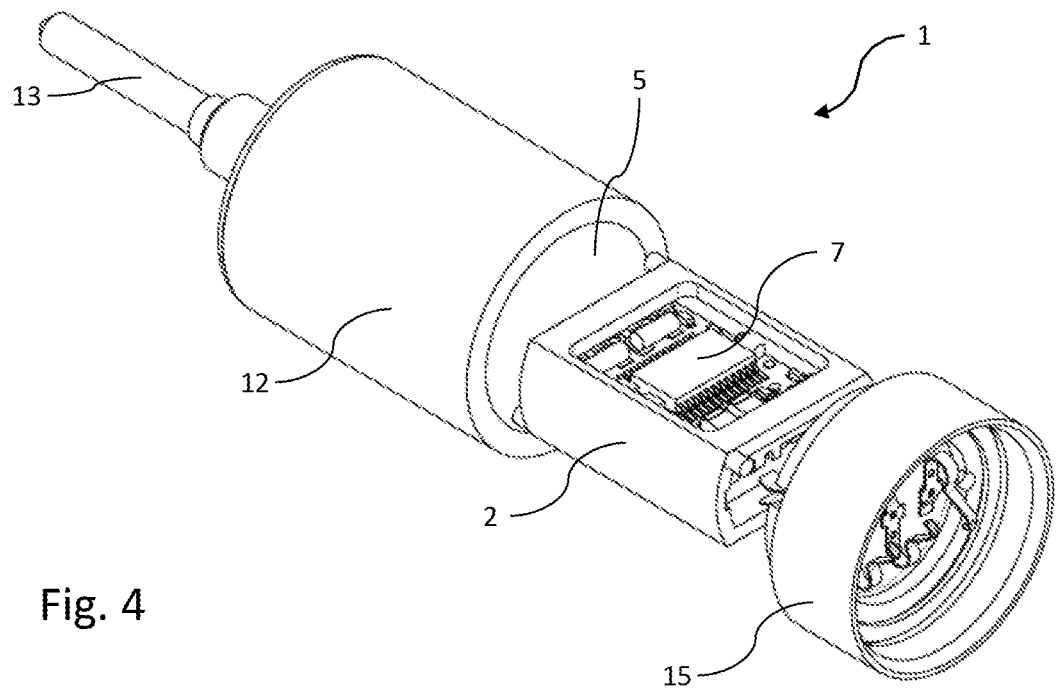
Figure 5:
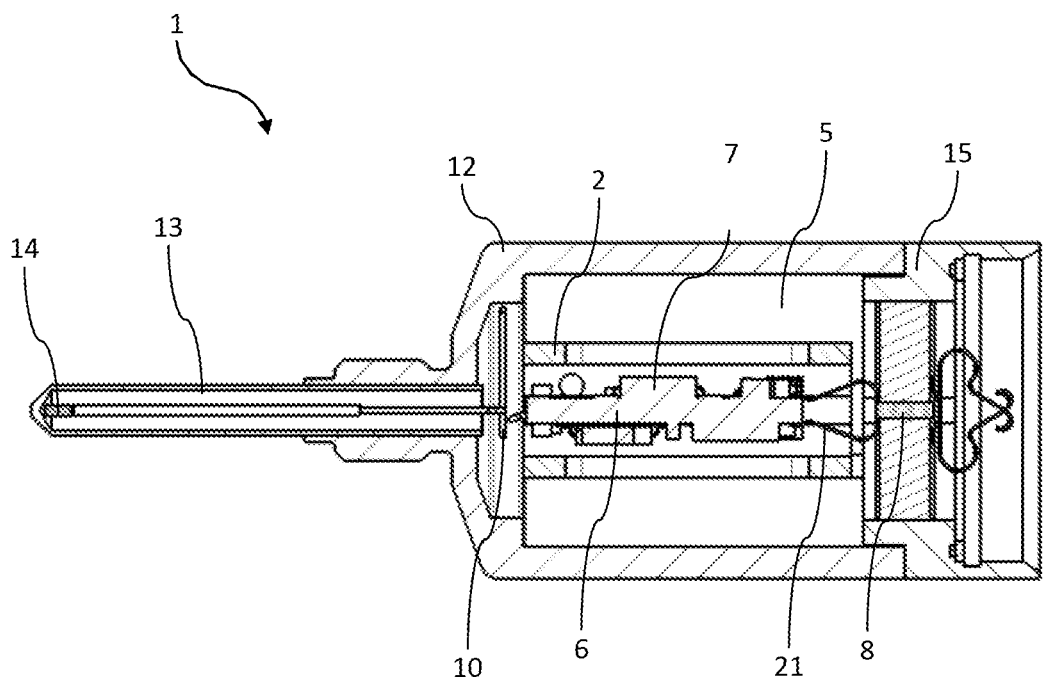

FIG. 4 shows an alternative embodiment of a device according to the invention 1. The same parts as in the embodiment of FIG. 1 to 3 are given the same reference numbers and are only once more described where there are differences.

The device 1 comprises a second housing 11, which is composed of multiple housing parts. A first housing part 12 is built similarly in principle to the embodiment of FIG. 2. Accordingly, the measuring tip 13 with a sensor 14 is arranged on this first housing part 12. The first housing part 12 is shaped as a hollow cylinder. In a departure from FIG. 2, the first housing part 12 has an interior space 5 in which the first housing 1 is entirely inserted and enclosed.

The device 1 comprises a first housing 2, in which the electronics 7 are arranged on a circuit board 6. The first housing 2 in this embodiment is substantially shaped as a frame around the circuit board 6. It is basically cuboidal here, the short sides being formed as circle sectors, so that they lie against the hollow cylindrical interior space 5. The contacting with the sensor 14 may likewise occur here for example via a c-board or a plug connection. The first housing 2 in this embodiment may be formed for example of plastic or some other material.

The second housing 11 furthermore comprises a second housing part 15, which is connected to the first housing part 12 via a gas-tight metal/metal connection. In the example, the second housing part 15 has an encircling rim, which engages with the interior space 5 of the first housing part 12.

Inside the second housing part 15 there is a glass/metal bushing 8, with which the electronics 7 can make contact. The second housing part 15 has a coupling for attaching a battery, which is not shown here, similar to the embodiment of FIG. 2.

Between the circuit board 6 and the second housing part 15 there is formed a plug connection, which produces an electrical contacting with the bushing 8.

The second housing 11 here may be formed entirely of the already described stainless steel. However, it is also possible for individual or all housing parts to be formed of ceramic, in which case the connection site between the two housing parts is metallized so that a gas-tight metal/metal connection can be realized.

LIST OF REFERENCE NUMBERS

1 Device
2 First housing
3 Hollow cylinder
4 Cover
5 Interior space
6 Circuit board
7 Electronics
8 Bushing
9 Contact pin
10 c-board 11 Second housing
12 First housing part
13 Measuring tip
14 Sensor
15 Second housing part
16 Battery
17 Third housing part
18 Internal thread
19 External thread
20 Fourth housing part
21 Contact
22 Seal
23 Battery compartment closure

The invention claimed is:

1. A device (1) for the detecting and registering measurement data, the device comprising:
   a first housing (2) in which electronics (7) are arranged,
   at least one sensor (14), which is electrically connected to the electronics (7),
   wherein the first housing (2) comprises at least two housing parts (3, 4), and the two housing parts (3, 4) have at least one metallic connection site and are joined together at the connection site by a gas-tight metal/metal connection, and the electronics (7) are arranged in a first housing (2),
   wherein the electronics (7) are arranged on a circuit board (6), and the circuit board (6) is mounted floating inside the first housing (2) or secured on one side, and
   a second housing (11), the at least one sensor (13) is arranged in the second housing (11), which encloses the first housing (2) substantially entirely, and the second housing (11) comprises at least two second housing parts (12, 15), which are detachably joined together.

2. The device (1) according to claim 1, wherein the gas-tight metal/metal connection is produced by welding or brazing.

3. The device (1) according to claim 1, wherein the first housing (2) comprises a tube (3) having end face openings, and the end face openings of the tube (3) are closed by covers (4), and at least one said cover (4) comprises a gas-tight metal/metal connection to the tube (3).

4. The device (1) according to claim 3, wherein at least one of the covers (4) comprises at least one feedthrough (8), with which an electrical connection is produced between the first housing (2) and the second housing (11).

5. The device (1) according to claim 1, wherein the circuit board (6) is at least one of electrically or mechanically connected to at least one feedthrough (8) by at least one of a flexible conductor or a c-board (10).

6. The device (1) according to claim 1, wherein the at least one sensor (13) is arranged in a first of the two second housing parts (12) and a power supply is arranged in a second of the two second housing parts (15), and the first housing (2) is arranged axially between the two housing parts (12, 15) of the second housing (11).

7. The device (1) according to claim 1, wherein the second housing (11) comprises a sleeve part (17), in which the first housing (2) is axially installed.

8. The device (1) according to claim 1, wherein the second housing parts (12, 15, 17, 20) are joined together by threads (18, 19).

9. The device (1) according to claim 8, wherein at least one of the threads (18, 19) comprises a thread locking, which prevents an unintentional opening.

10. The device (1) according to claim 9, wherein the thread locking is formed by a shape deviation of a thread.

11. The device (1) according to claim 1, wherein the electronics (7) are arranged in the first housing (2), and the at least one sensor (13) is arranged in the second housing (11), which substantially entirely encloses the first housing (2) and which comprises the at least two second housing parts (12, 15) that are joined together by a gas-tight metal/metal connection.

12. The device (1) according to claim 1, wherein the housing parts (3, 4) of the first housing (2) are made of stainless steel, and the second housing parts (12, 15, 17, 20) are formed of at least one of metal, plastic, or ceramic.

13. The device (1) according to claim 1, wherein at least one of the first housing (2) or the second housing (11) has a circular cross section.

* * * * *